(12) United States Patent
Najafi-Yazdi et al.

(10) Patent No.: US 11,480,299 B1
(45) Date of Patent: Oct. 25, 2022

(54) CRYOSTAT AND QUANTUM COMPUTING SYSTEM HAVING SAME

(71) Applicant: ANYON SYSTEMS INC., Dorval (CA)

(72) Inventors: Alireza Najafi-Yazdi, Vaudreuil-Dorion (CA); Chris Peirone, Windsor (CA); Justin Huneault, Montréal (CA)

(73) Assignee: ANYON SYSTEMS INC., Dorval (CA)

( * ) Notice: Subject to any disclaimer, the term of this patent is extended or adjusted under 35 U.S.C. 154(b) by 0 days.

(21) Appl. No.: 17/701,540

(22) Filed: Mar. 22, 2022

(51) Int. Cl.
| F17C 3/08 | (2006.01) |
| F17C 13/00 | (2006.01) |
| G06N 10/40 | (2022.01) |

(52) U.S. Cl.
CPC ............ F17C 3/085 (2013.01); G06N 10/40 (2022.01); F17C 2201/0157 (2013.01); F17C 2201/0166 (2013.01); F17C 2221/017 (2013.01); F17C 2223/0161 (2013.01); F17C 2270/0527 (2013.01)

(58) Field of Classification Search
CPC .................................................... G06N 10/40
USPC ........................................................ 62/55.5
See application file for complete search history.

(56) References Cited

U.S. PATENT DOCUMENTS

| 6,202,439 | B1 | 3/2001 | Mikheev et al. |
| 6,758,059 | B2 | 7/2004 | Kelly et al. |
| 9,134,047 | B2 | 9/2015 | Black et al. |
| 9,816,750 | B2 | 11/2017 | Batey et al. |
| 10,378,803 | B2 | 8/2019 | Uchaykin |
| 10,422,561 | B2 | 9/2019 | Blaauwgeers |
| 10,790,432 | B2 | 9/2020 | Bernardo et al. |
| 11,064,637 | B2 | 7/2021 | Sterling et al. |
| 11,125,475 | B2 | 9/2021 | Matthews |
| 11,181,574 | B2 | 11/2021 | Junes et al. |
| 11,226,365 | B2 | 1/2022 | Chen et al. |
| 2011/0009274 | A1* | 1/2011 | Uchaykin ............ H05K 9/0077 505/150 |
| 2018/0306493 | A1* | 10/2018 | James .................... F25D 31/006 |
| 2019/0383525 | A1 | 12/2019 | Matthews et al. |
| 2021/0326739 | A1 | 10/2021 | Jeffrey |

(Continued)

Primary Examiner — John F Pettitt, III
(74) Attorney, Agent, or Firm — Norton Rose Fulbright Canada LLP (57) ABSTRACT

A cryostat, such as for a quantum computing system, includes a plurality of temperature-controlled flanges operable to be cooled to respective cryogenic target temperatures, the temperature-controlled flanges being nested one inside another and concentrically arranged about a central axis. The temperature-controlled flanges are radially spaced apart and define closed polygonal perimeters. The temperature-controlled flanges including an outermost flange defining a vacuum chamber, an innermost flange enclosing a central core of the cryostat, and intermediate flanges radially located between the innermost flange and the outermost flange. Each of the intermediate flanges surrounds one or more of the other temperature-controlled flanges. The outermost flange is maintained at a highest temperature, the innermost flange is maintained at a lowest temperature, and the intermediate flanges are maintained at respective intermediate temperatures less than the highest temperature and greater than the lowest temperature.

21 Claims, 8 Drawing Sheets

(56) References Cited

U.S. PATENT DOCUMENTS

2021/0402407 A1  12/2021  Hoehne
2022/0092459 A1   3/2022  Bogorin et al.

* cited by examiner

CRYOSTAT AND QUANTUM COMPUTING SYSTEM HAVING SAME

TECHNICAL FIELD

This disclosure generally relates to the field of quantum computing, and more specifically to cryostat refrigeration chambers for quantum computers.

BACKGROUND

Quantum computers are machines that harness the properties of quantum states, such as superposition, interference, and entanglement, to perform computations. In a quantum computer, the basic unit of memory is a quantum bit, or qubit, which can only be detected at extremely low energy levels and at temperatures close to absolute zero. This requires cryogenic refrigeration systems with multiple stages of cooling and numerous Radio Frequency (RF) cryogenic cables of significant length.

A quantum computer with enough qubits has a computational power inaccessible to a classical computer, which is referred to as "quantum advantage". Indeed, computational power increases with the number of qubits. While the quality of qubits has been an important technical challenge to the advancement of quantum computing, there are also many physical challenges associated with building a large-scale quantum computer. The control of multi-qubit systems requires the generation and coordination of a large number of electrical signals, with lots of cabling, a large cooling system, and many other components.

SUMMARY

There is accordingly provided a cryostat, the cryostat comprising: a plurality of temperature-controlled flanges operable to be cooled to respective cryogenic target temperatures, the temperature-controlled flanges being nested one inside another and concentrically arranged about a central axis, the temperature-controlled flanges being radially spaced apart and defining closed polygonal perimeters, the temperature-controlled flanges including an outermost flange defining a vacuum chamber, an innermost flange enclosing a central core of the cryostat, and intermediate flanges radially located between the innermost flange and the outermost flange, each of the intermediate flanges surrounding one or more of the other temperature-controlled flanges; and wherein the outermost flange is maintained at a highest temperature, the innermost flange is maintained at a lowest temperature, and the intermediate flanges are maintained at respective intermediate temperatures less than the highest temperature and greater than the lowest temperature.

The cryostat as defined above and described herein may further include one or more of the following features and/or elements, in whole or in part, and in any combination.

In certain aspects, each of the temperature-controlled flanges includes a set of interconnected walls defining the closed polygonal perimeter about the central axis, each said set of interconnected walls including at least two non-parallel walls.

In certain aspects, the closed polygonal perimeter of the innermost flange defines a first polygonal shape in a plane normal to the central axis and the closed polygonal perimeter of at least one of the remaining temperature-controlled flanges defines a second polygonal shape in the plane.

In certain aspects, the second polygonal shape is different than the first polygonal shape.

In certain aspects, the closed polygonal perimeter of at least one of the temperature-controlled flanges defines a hexagonal shape in a plane normal to the central axis.

In certain aspects, at least one wall of the set of interconnected walls defining the innermost flange is parallel to at least one wall of each set of interconnected walls of the remaining of the temperature-controlled flanges.

In certain aspects, the at least one wall of the set of interconnected walls defining the innermost flange and the at least one wall of each set of interconnected walls of the remaining of the temperature-controlled flanges each include one or more aligned apertures defined therethrough to provide line of sight access extending through the aligned apertures from an exterior of the cryostat to the central core enclosed within the innermost flange.

In certain aspects, the central axis extends in a non-vertical direction.

In certain aspects, the central axis extends horizontally.

In certain aspects, the set of interconnected walls of the innermost flange includes a greater number of interconnected walls than one or more of the sets of interconnected walls of the remaining of the temperature-controlled flanges.

There is also provided a quantum computing system, comprising: a quantum processor comprising at least one qubit; quantum hardware connected to the quantum processor; and a dilution refrigerator comprising: a pumping system; and a cryostat in communication with the pumping system for circulation of a cooling mixture therethrough, comprising temperature-controlled flanges nested one inside another and concentrically arranged about a central axis, the temperature-controlled flanges being radially spaced apart and defining closed polygonal perimeters, the temperature-controlled flanges defining cooling stages between radially-adjacent ones of the temperature-controlled flanges, the temperature-controlled flanges including an outermost flange defining a vacuum chamber, an innermost flange enclosing a central core of the cryostat housing the quantum processor, and intermediate flanges radially located between the innermost flange and the outermost flange, each of the intermediate flanges surrounding one or more of the other temperature-controlled flanges; wherein the pumping system is operable to cool at least the intermediate flanges and the innermost flange to respective cryogenic target temperatures, with the outermost flange at a highest temperature, the innermost flange maintained at a lowest temperature, and the intermediate flanges maintained at respective intermediate temperatures less than the highest temperature and greater than the lowest temperature.

The quantum computing system as defined above and described herein may further include one or more of the following features and/or elements, in whole or in part, and in any combination.

In certain aspects, the quantum computing system further comprises one or more additional cryostats aligned with the cryostat along the central axis and engaged in series therewith to form a larger modular cryostat, wherein each of the cooling stages of the cryostat are open to corresponding cooling stages of the one or more additional cryostats.

In certain aspects, each of the temperature-controlled flanges includes a set of interconnected walls defining the closed polygonal perimeter about the central axis, each said set of interconnected walls including at least two non-parallel walls.

In certain aspects, the closed polygonal perimeter of the innermost flange defines a first polygonal shape in a plane normal to the central axis and the closed polygonal perimeter of at least one of the remaining temperature-controlled flanges defines a second polygonal shape in the plane different than the first polygonal shape.

In certain aspects, the closed polygonal perimeter of at least one of the temperature-controlled flanges defines a hexagonal shape in a plane normal to the central axis.

In certain aspects, at least one wall of the set of interconnected walls defining the innermost flange is parallel to at least one wall of each set of interconnected walls of the remaining of the temperature-controlled flanges.

In certain aspects, the at least one wall of the set of interconnected walls defining the innermost flange and the at least one wall of each set of interconnected walls of the remaining of the temperature-controlled flanges each include one or more aligned apertures defined therethrough to provide line of sight access extending through the aligned apertures from an exterior of the cryostat to the central core enclosed within the innermost flange.

In certain aspects, the central axis extends in a non-vertical direction.

In certain aspects, the central axis extends horizontally.

In certain aspects, the set of interconnected walls of the innermost flange includes a greater number of interconnected walls than one or more of the sets of interconnected walls of the remaining of the temperature-controlled flanges.

There is further provided a modular cryostat assembly comprising two or more cryostats, each cryostat of the two or more cryostats comprising: temperature-controlled flanges operable to be cooled to respective target temperatures, the temperature-controlled flanges being nested one inside another and concentrically arranged about a central axis, the temperature-controlled flanges defining cooling stages between radially-adjacent ones of the temperature-controlled flanges, the temperature-controlled flanges including an outermost flange defining a vacuum chamber, an innermost flange enclosing a central core of the cryostat, and intermediate flanges radially located between the innermost flange and the outermost flange, each of the intermediate flanges surrounding one or more of the other temperature-controlled flanges, the outermost flange operating at a highest temperature, the innermost flange operating at a lowest temperature, and the intermediate flanges operating at respective intermediate temperatures less than the highest temperature and greater than the lowest temperature; and wherein the two or more cryostats include a first cryostat and a second cryostat arranged adjacent one another in series, the first cryostat and the second cryostat being concentric with the central axis, axial ends of the temperature-controlled flanges of the first cryostat being connected with axial ends of corresponding ones of the temperature-controlled flanges of the second cryostat, and the cooling stages of the first cryostat being open to corresponding ones of the cooling stages of the second cryostat.

The modular cryostat assembly as defined above and described herein may further include one or more of the following features and/or elements, in whole or in part, and in any combination.

In certain aspects, the temperature-controlled flanges of the two or more cryostats are radially spaced apart to define closed polygonal perimeters about the central axis.

In certain aspects, each of the temperature-controlled flanges of the two or more cryostats includes a set of interconnected walls defining the closed polygonal perimeters about the central axis, the set of interconnected walls including at least two non-parallel walls.

Many further features and combinations thereof concerning the present improvements will appear to those skilled in the art following a reading of the instant disclosure.

DETAILED DESCRIPTION

Figure 1:
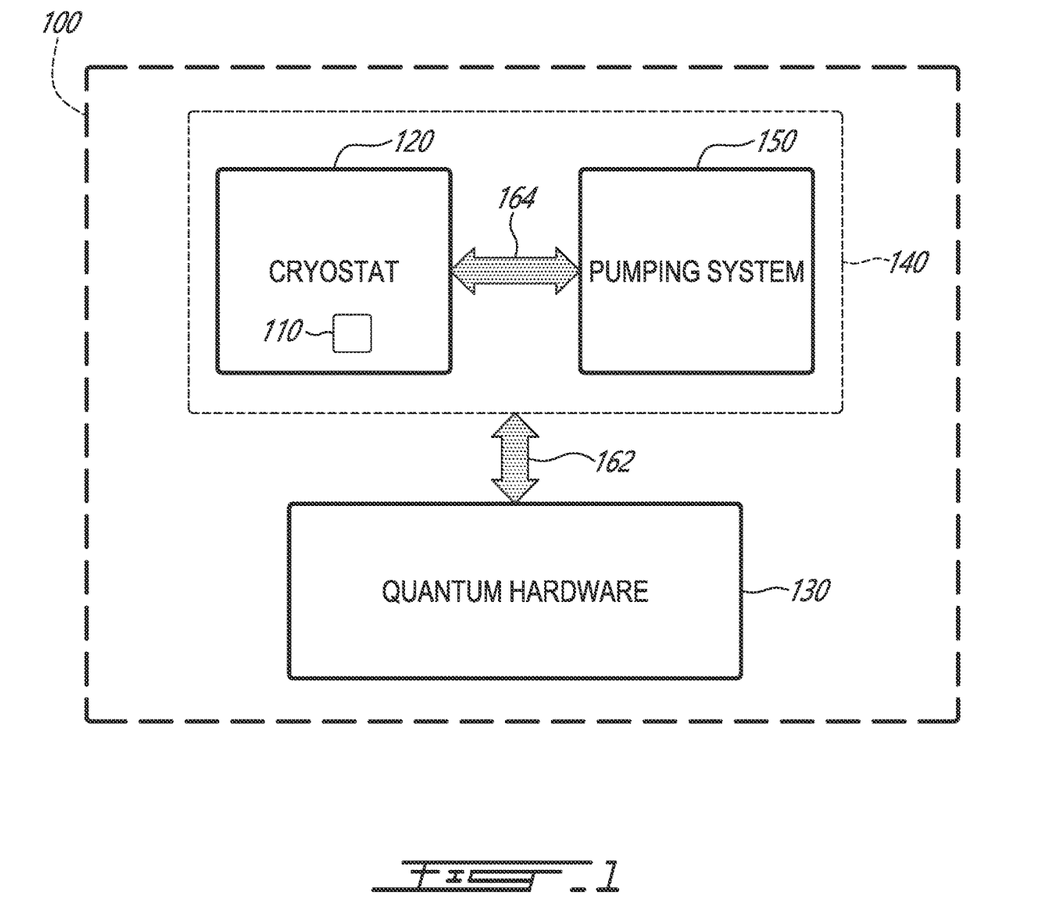
FIG. 1 is a schematic representation of a quantum computing system in accordance with the present disclosure, the quantum computing system including a cryostat as described herein.

As schematically shown in FIG. 1, a quantum computing system 100 of the present disclosure includes generally quantum hardware 130, which is used herein to refer to any component or equipment used for operation of a quantum computer, such as but not limited to electronics, power supplies, network switches, circuit breakers, programmable logic controllers, data acquisition systems, terminal blocks, connectors, and the like. The quantum hardware may be disposed inside one or more housing structure and interconnected using various wired and/or wireless connections. The quantum computing system 100 also comprises a dilution refrigerator 140, composed of a cryostat 120 and a pumping system 150, to which the quantum hardware 130 is coupled via a plurality of interconnects 162. The cryostat 120 is a low temperature vessel that houses a quantum processor 110 having one or more qubits. The pumping system 150 is coupled to the cryostat 120 via interconnects 164 which may include piping, cabling and/or wiring, and comprises various components, such as pumps, valves, tanks and the like, needed to pump a Helium isotope mixture into the cryostat 120 and provide proper cooling thereof. It is to be understood that the quantum computing system 100 may also include other components, as will be appreciated by one skilled in the art, which have been omitted from the figures for ease of understanding and will not be described in additional detail herein for similar reasons.

The cryostat 120 of the quantum computing system 100 will now be described in further detail below. It is however to be understood that the cryostat 120, as described in the present disclosure need not be limited to its use in a quantum computing system 100, but may be employed in other suitable contexts where cryogenic cooling is required.

Figure 2:
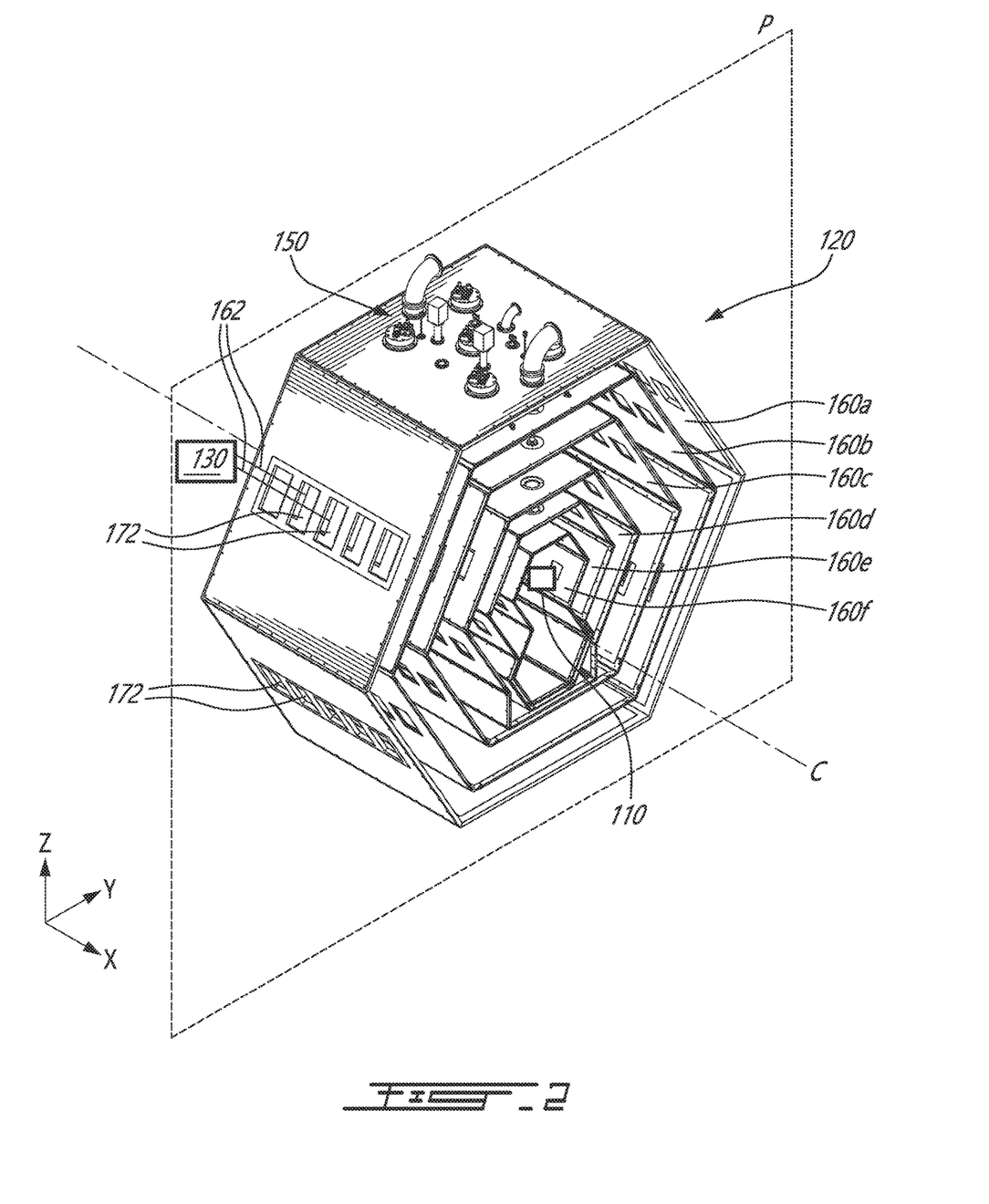
FIG. 2 is a perspective view of a cryostat in accordance with the present disclosure, shown partially assembled for ease of exaptation.
Figure 3:
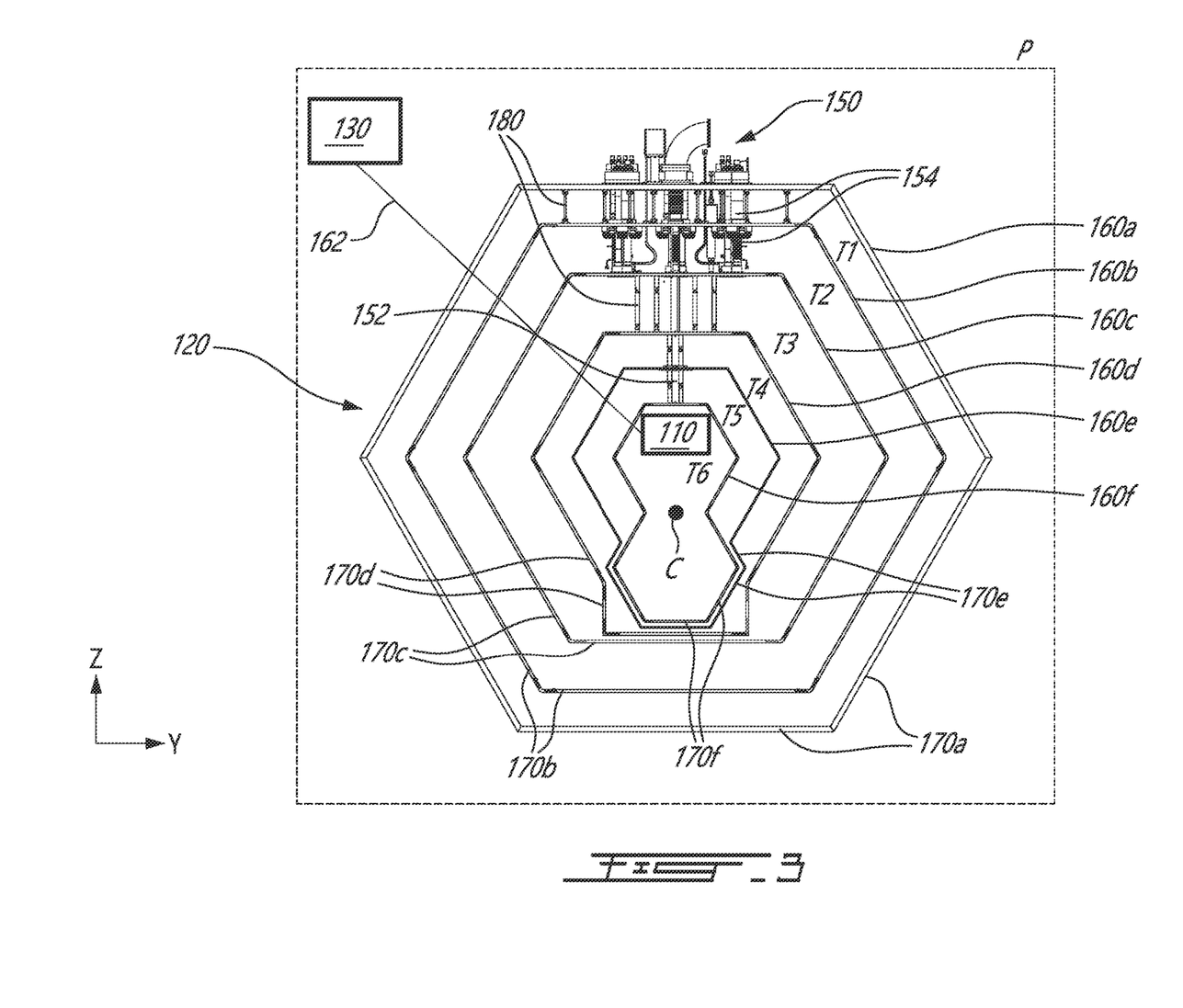
FIG. 3 is a front view of the cryostat of FIG. 2.
Figure 4:
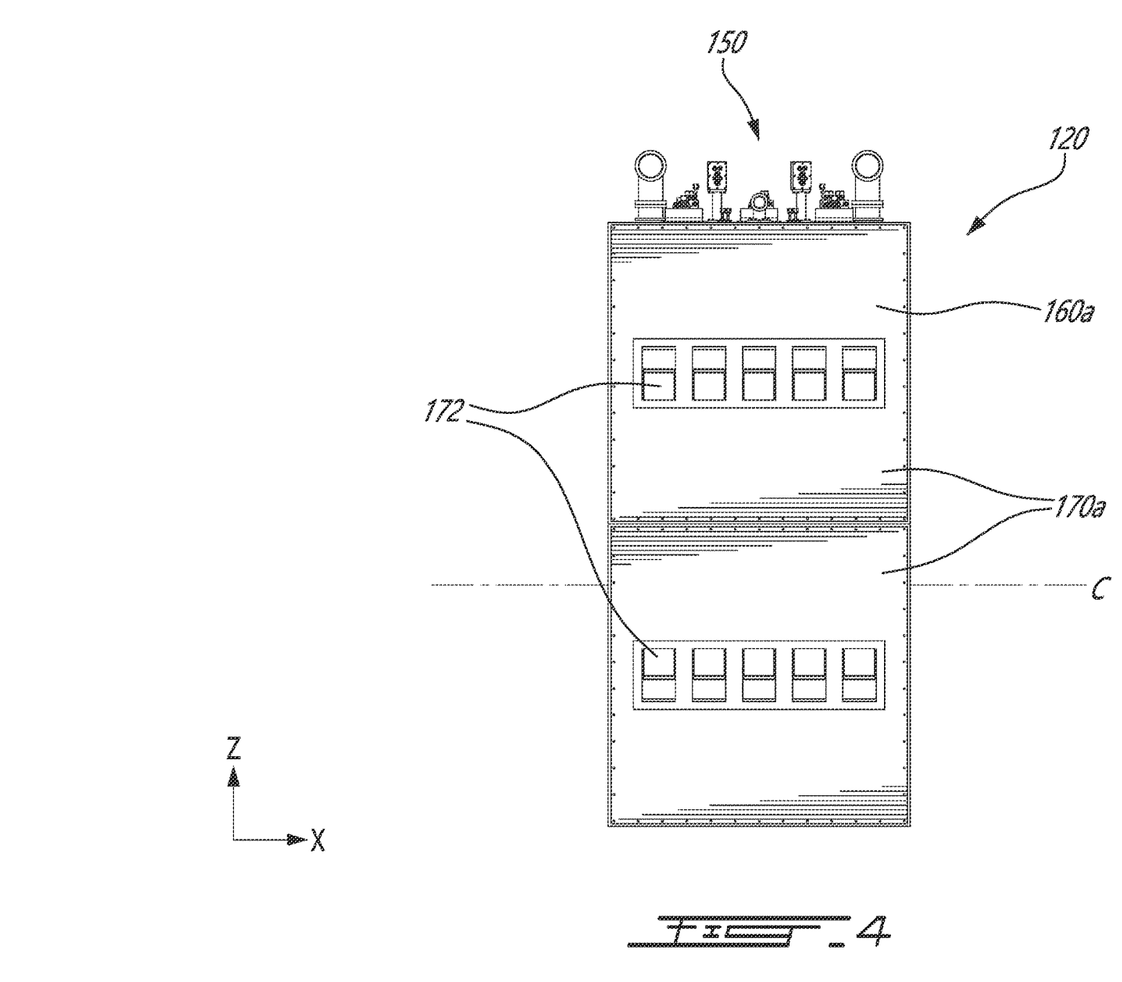
FIG. 4 is a side view of the cryostat of FIG. 2.
Figure 5:
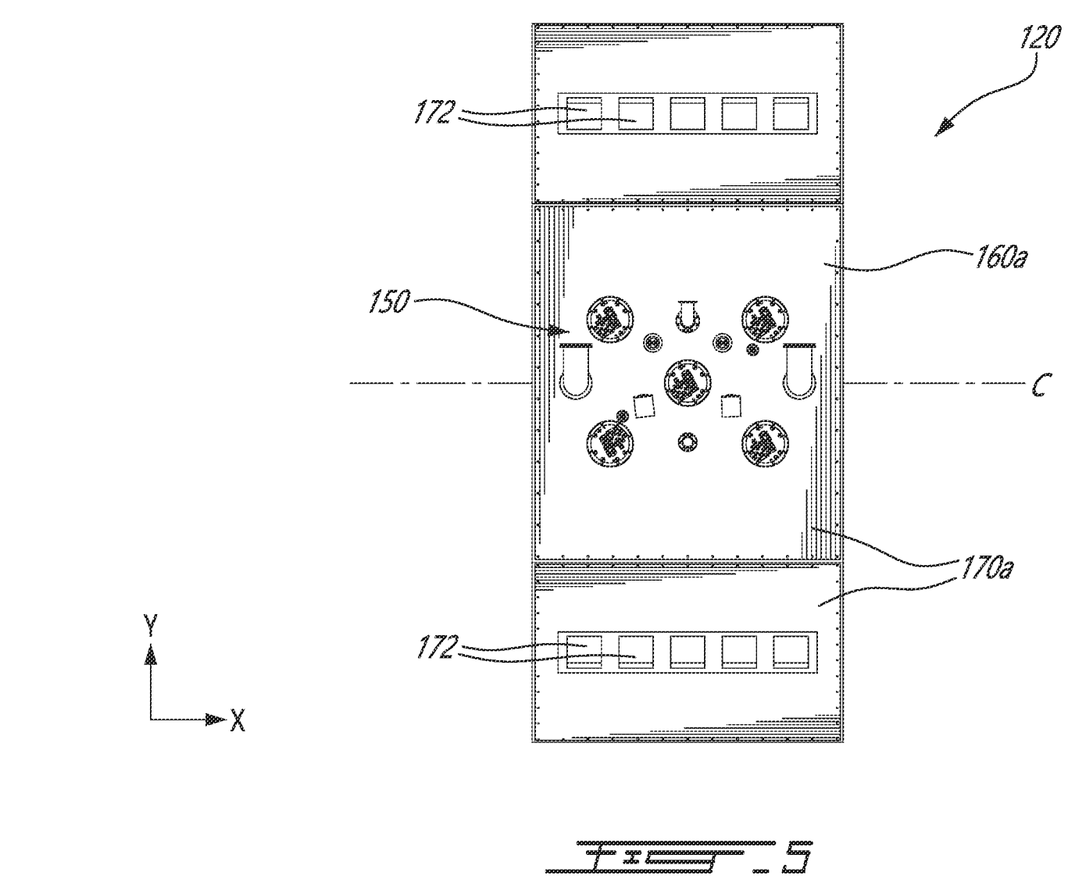
FIG. 5 is a top view of the cryostat of FIG. 2.

With additional reference to FIGS. 2-3, control and readout of the qubits in the quantum processor 110 is performed by the quantum hardware 130, which is disposed outside the cryostat 120 while being in communication with the quantum processor 110 housed within a core of the cryostat 120. It will be understood that some of the quantum hardware 130 involved in the control and readout of the qubits may also be integrated, in part or in whole, inside the cryostat 120, depending on practical applications. Signals may be transmitted between the quantum processor 110 and the quantum hardware 130 via the interconnects 162, which for example may be a plurality of coaxial lines entering and exiting the cryostat 120. The pumping system 150, illustratively connected to the cryostat 120 at a top surface thereof, is configured for cooling a plurality of nested temperature-controlled flanges 160 inside the cryostat 120, as will be discussed in further detail below. While quantum processor 110, quantum hardware 130 and interconnects 162 are illustratively depicted in FIGS. 2 and 3, they are omitted from the remaining figures for simplicity. If the cryostat 120 is used outside of a quantum computing system 100, for example for testing of devices or other components operable to perform at similar cryogenic temperatures, such devices under test would be disposed within the core of the cryostat 120 in lieu of the quantum processor 110.

Referring now to FIGS. 2-5, the cryostat 120 includes a plurality of nested temperature-controlled flanges 160, illustratively six flanges 160a-160f, disposed one inside the other in a nested and/or concentric fashion. The temperature-controlled flanges 160a-160f are radially spaced apart, relative to a longitudinally-extending central axis C, such as to define enclosed stages therebetween. In the depicted embodiment, the longitudinally-extending central axis C may be substantially horizontal (or substantially parallel to a surface on which the cryostat 120 is located), however in alternate embodiments the central axis C may be disposed at another, non-vertical, orientation as required. The term "substantially horizontal" as used herein in the context of the central axis C is understood to include ±10 degrees from horizontal, in order to allow for minor discrepancies in orientations of the supporting substrate, manufacturing tolerances, temperature-induced variations, and the like. Each flange 160 of the nested flanges 160a-160f includes a set of interconnected walls 170 defining a closed perimeter extending about the central axis C. As such, at least two walls of each set of interconnected walls 170 are non-parallel, creating each closed perimeter. In some embodiments, the walls 170 may be integrally formed.

The nested flanges 160 thus form a plurality of nested and/or concentric temperature stages T, defined between adjacent ones of the nested temperature-controlled flanges 160. In the shown embodiment, the cryostat 120 includes six temperature stages T1-T6 becoming progressively colder from an outermost temperature stage T1 to an innermost temperature stage T6. In other words, the temperature stages T1-T6 are stages at which a corresponding flange 160a-160f is set to a predetermined temperature. As seen in FIG. 3, the innermost, and coldest, temperature stage T6 is located at a central core of the cryostat 120, with the remaining temperature stages T5-T1 successively surrounding the central core stage T6. The pumping system 150 is configured for cooling and maintaining at least some of the flanges 160a-160f at respective predetermined temperatures. In an exemplary embodiment, flanges 160b-160f may be cooled to predetermined temperatures, while outermost flange 160a, which is configured for maintaining vacuum conditions within the cryostat, may be maintained at room temperature and thus may not directly receive cooling. While the depicted embodiment includes six nested flanges 160, namely flanges 160a-160f, it is to be understood that the cryostat 120 may have fewer or more than this number of flanges and temperature stages T. The outermost flange 160a, and thus its set of interconnected walls 170a, forms the exterior of the cryostat 120. The innermost flange 160f, also referred to as the central core of the cryostat 120, houses the quantum processor 110. The various interconnected walls 170, and thus each of the nested flanges 160, may further include radiation shields to block thermal radiation from higher temperature stages reaching lower temperature stages. For example, a shield at flange 160b blocks thermal radiation from flange 160a to flange 160c, a shield at flange 160c blocks radiation from flange 160b to 160d and a shield at flange 160d blocks radiation from flange 160c to flanges 160e and 160f. A magnetic shield at flange 160f may be used to protect the quantum processor 110 from unwanted magnetic fields. The radiation shields, as well as their connection points to respective flanges 160a-160f, may be flexible and/or otherwise thermally compliant such as to account for thermal contraction and/or expansion, such as but not limited to, thermal contraction along the central axis C.

The pumping system 150 is configured for cooling at least some of the flanges 160a-160f (i.e., each temperature stage T1-T6) of the cryostat 120 to a predetermined temperature. By "cooling", it is understood that the pumping system 150 is also configured for maintaining each flange 160 at its predetermined temperature once a given temperature target has been reached. Various means for cooling the flanges are contemplated, for instance pulse tube-based cooling systems and continuous flow helium-based cooling systems. The pumping system 150 may therefore comprise a compressor package, which is external to the cryostat 120, and which is in communication with internal cooling components (e.g. dilution units 152, pulse tube coolers 154, etc.) within the cryostat 120 itself. The exemplary pumping system 150 depicted in the figures may therefore include various fluid-handling pipes or tubes passing through the walls 170 of the cryostat 120 for distributing cryogenic fluids, such as gaseous and/or liquid helium, nitrogen and/or oxygen throughout the cryostat 120, with the primary fluid handling components disposed above the cryostat 120. For instance, cooling of the lower temperature stages T4-T6 may be provided by a dilution unit 152 connected to a gas handling portion of the pumping system 150 that is located outside the cryostat 120, while pulse tube cryocoolers 154 (or simply "pulse tubes") may be provided to cool the higher temperature stages T2-T3. Other cooling arrangements may be contemplated. The pumping system 150 further includes means for creating vacuum conditions in the cryostat 120, which forms a vacuum chamber when in operation. In some embodiments, only the outermost flange 160a, also referred to as the vacuum can, is hermetically sealed to maintain the vacuum conditions inside the cryostat 120, and may also be referred to as the 300K (i.e. room temperature or T1) flange. These means for creating vacuum conditions in the cryostat 120 may include suitable vacuum pumps and associated piping, as will be understood by those skilled in the art. In an exemplary embodiment, the outermost temperature stage T2 defined by the first temperature-controlled flange 160b within the outer flange 160a, may be set to approximately 30K-80K, and intermediate temperature stages T3-T5 (respectively defined by intermediate flanges 160c-160e) may be respectively set to approximately 2K-6K, 600 mK to 1K and 50 mK-150 mK, while the innermost temperature stage T6, i.e., the coldest temperature stage, defined by the innermost temperature-controlled flange 160f, may be set to approximately 4 mk-40 mK. In a specific embodiment, the outermost temperature stage T2 may be set to approximately 50K, the intermediate temperature stages T3-T5 may be respectively set to approximately 4K, 800 mK and 100 mK, and the innermost temperature stage T6 may be set to approximately 8 mK, The temperature of the innermost temperature stage T6, i.e. the coldest temperature stage, may be appropriately set based on the requirements of the quantum processor 110 housed therein. Intermediate temperature stages T2-T6 may be set to progressively decreasing temperatures between those selected for stages T1 and T6. Other set temperatures may be contemplated.

As discussed above, the interconnected walls 170 of each flange 160 define a closed perimeter extending about the central axis C. Said perimeters may define a polygonal shape in a plane P normal to the central axis C. In particular, each flange 160a-160f extends axially from a forward edge to a rearward edge to define an axial length of the flange, extending in a circumferential direction with multiple wall segments 170 defining the closed polygonal shape. In certain embodiments, one or more of these polygonal-shaped perimeters may be concentric with the central axis C. However, one or more of the perimeters may also be eccentric relative to the central axis. In the depicted embodiment, central axis C passes through a center of the innermost flange 160f in a direction parallel to a horizontal X-axis. Plane P, which is normal to the X-axis, is thus defined by the Y (horizontal) and Z (vertical) axes normal to the X-axis. Each flange 160 may have substantially the same properties about its perimeter.

In the depicted embodiment, the polygonal shapes of the various flanges 160 vary. Illustratively, outermost flange 160a and intermediate flanges 160b, 160c are shaped as regular hexagons, i.e. having six interconnected walls 170a-170c of equal length, with congruent angles separating each interconnected wall 170a-170c. Intermediate flange 160d is shaped as an irregular octagon, with eight interconnected walls 170d of unequal lengths with unequal angles defined therebetween. Intermediate flange 160e and innermost flange 160f are shaped as irregular decagons, with ten interconnected walls 170e, 170f of unequal lengths with unequal angles defined therebetween. Other shapes for each flange 160 may be contemplated, for instance square or rectangular, as well as other non-regular shapes. For instance, in some embodiments, each flange 160 apart from the innermost flange 160f may have the same polygonal shape, with the innermost flange 160f having a greater number of interconnected walls 170 than the other flanges 160, for instance to provide additional surface area for connections to the quantum processor 110 housed therein. In another embodiment, each flange 160 may have the same polygonal shape. In some embodiments, the intermediate flanges, illustratively 160b-160e, may be at least partially or substantially annularly-shaped. In other words, the intermediate flanges 160b-160e may or may not be completely annular. For instance, the intermediate flanges 160b-160e may include circumferential interruptions or non-constant radial shapes. Other shapes and combinations may be contemplated as well.

The radial spacing between flanges 160 in the plane P may vary. Illustratively, due to variations in the polygonal shapes formed by flanges 160e and 160f, the radial spacing between flanges 160e and 160f varies based on a circumferential location about their perimeters. In other cases, the radial spacing is consistent about the perimeters of flanges 160, for instance between flanges 160a and 160b, due to their similar polygonal shapes. Various radial spacings between radially adjacent flanges 160 may be contemplated. In the shown embodiment, a plurality of support posts 180 hold the various interconnected walls 170, and thus the flanges 160, at predetermined and fixed radial distances or separations from one another. The number and placement of such support posts 180 may vary about the perimeters of the flanges 160, and such supports can be positioned as required.

While the number and arrangement of interconnected walls 170 of each flange 160 may vary, in various embodiments each set of interconnected walls 170 may include at least one common parallel wall. In other words, at least one wall of the set of interconnected walls 170 of a given flange 160 is parallel to at least one wall of each set of interconnected walls 170 of the other flanges 160. Such parallel walls permit a line of sight access from the exterior of the cryostat 120 directly to the innermost flange 160f (i.e., to the core), via aligned openings or apertures 172 in each parallel wall 170. Such apertures may facilitate the passing of cables or wires to and/or from the core, and may be sealable or coverable when not in use. When not occupied, one or more apertures 172 may be sealed by a cover 174. As each flange 160 is defined by a plurality of walls 170 rather than a single, horizontal plate or flange, the available surface area for passing wires or cables, or for mounting various components and providing various connections, in each temperature stage T may be increased. Thus, two or more of the walls 170 of each of the flanges in the nested flange arrangement can provide access to the central core of the cryostat 120, providing increased access for any required cabling and the like between the quantum processor 110 in the core and the surrounding environment.

Figure 6:
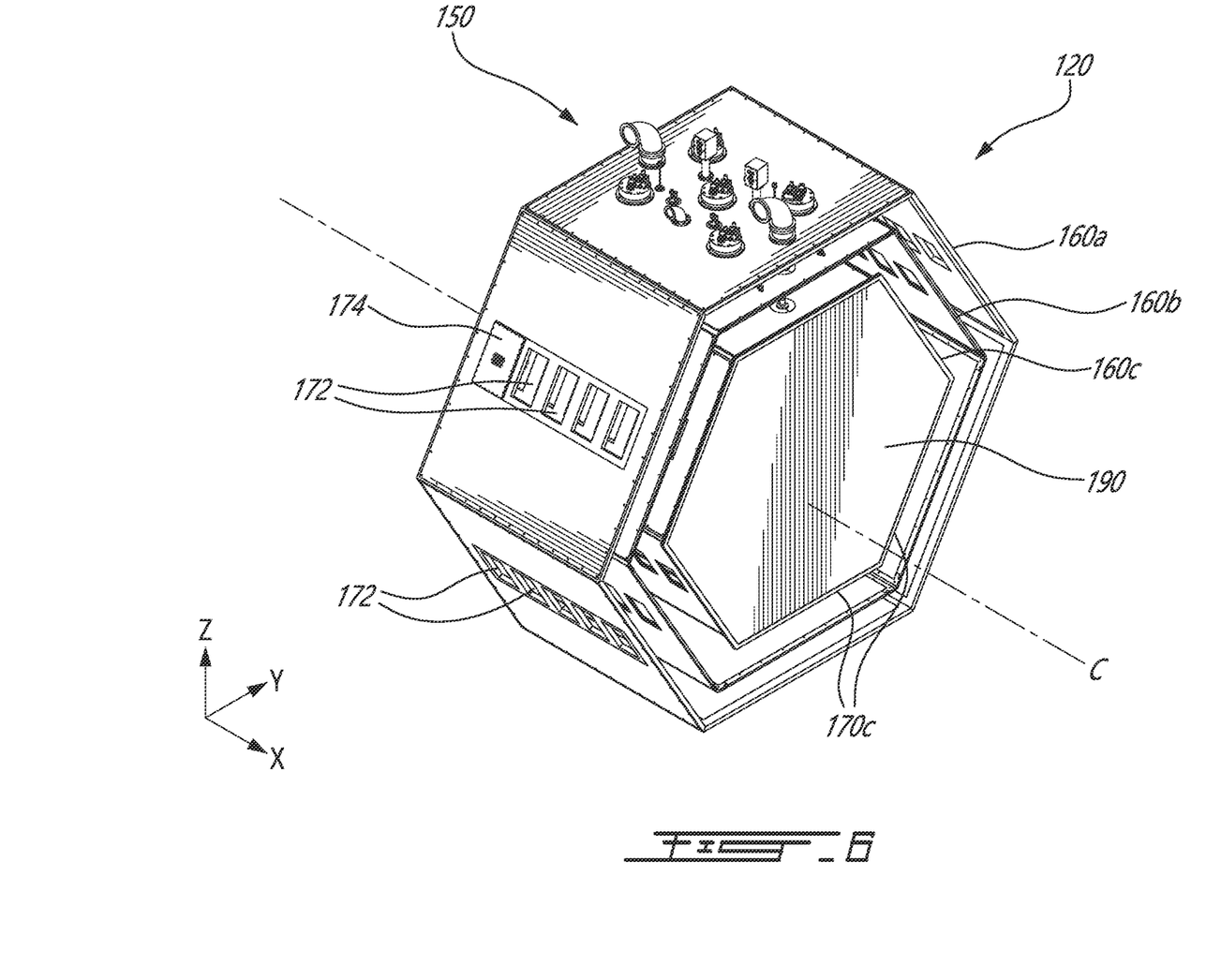
FIG. 6 is a perspective view of the cryostat of FIG. 2, shown partially closed.

Referring additionally to FIG. 6, the various flanges 160 may be closed via end plates 190 interconnecting ends of the walls 170, and this for each of the nested flanges 160. Such end plates 190 extend laterally in a direction parallel to the plane P and are normal to the central axis C. In an exemplary embodiment, the end plates 190 may act as radiation shields for the cryostat 120. In the shown case, for demonstrative purposes, two plates 190 (only one shown) cover or seal temperature stages T3-T6 by interconnecting the walls 170 of intermediate flange 160c. The one or more plates 190 may abut the walls 170 of each flange 160 which it closes to ensure that the various temperature stages T are shielded. In other embodiments, a first set of plates 190 may seal the innermost flange 160f, with additional plates 190 used to seal the other flanges 160a-160e. In the shown case, the plate 190 is sized to engage with each of the interconnected walls 170 of a given flange 160 and thus seal an entire side of a temperature stage T on its own. In other cases, various plates 190 may combine to engage different interconnected walls 170 of a given flange 160, thus combining to seal a side of a temperature stage T. Other shapes, sizes and combinations thereof of plates 190 may be contemplated as well.

Figure 7:
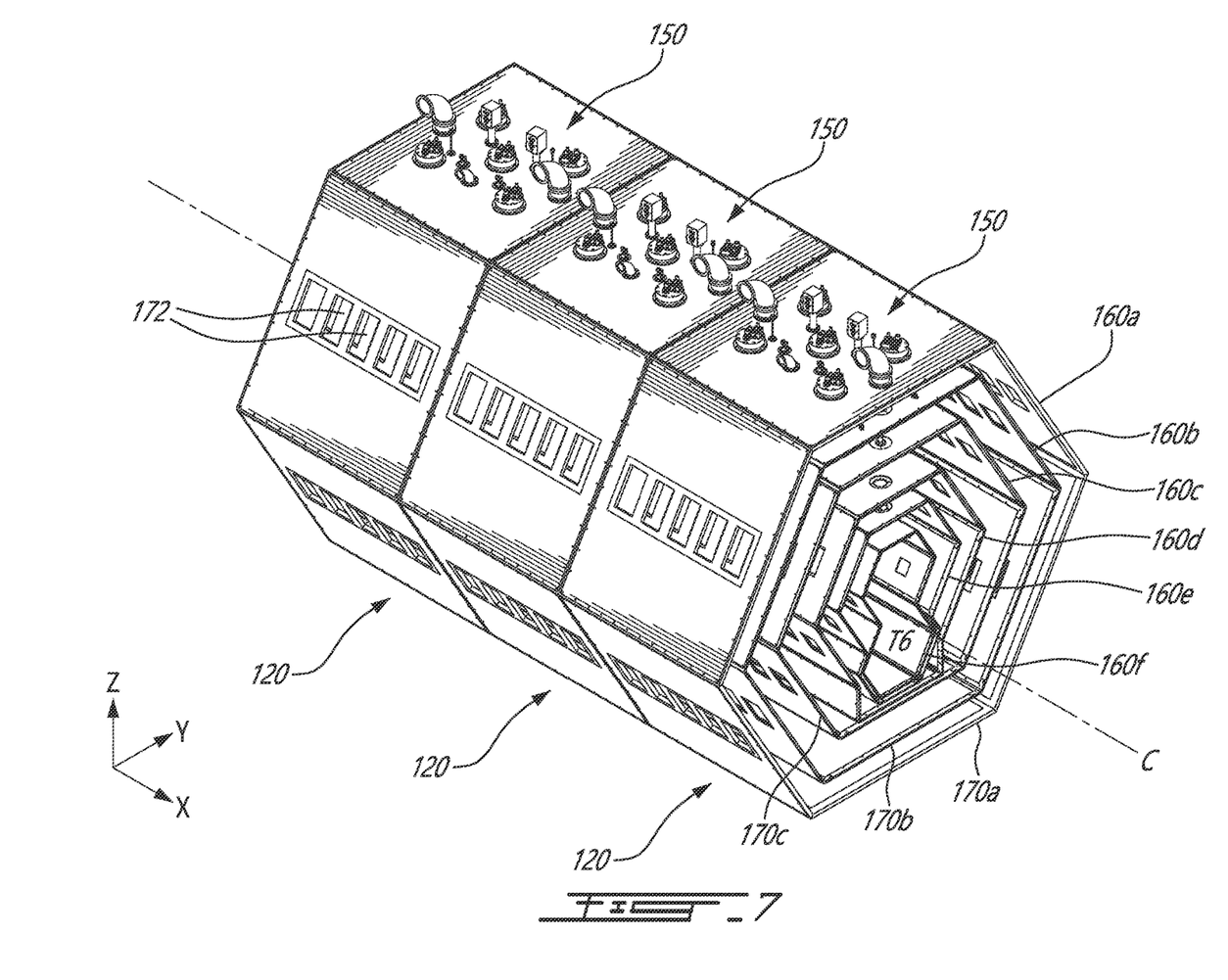
FIG. 7 is perspective view of multiple ones of the cryostats of FIG. 2 assembled together to form a modular cryostat assembly.
Figure 8:
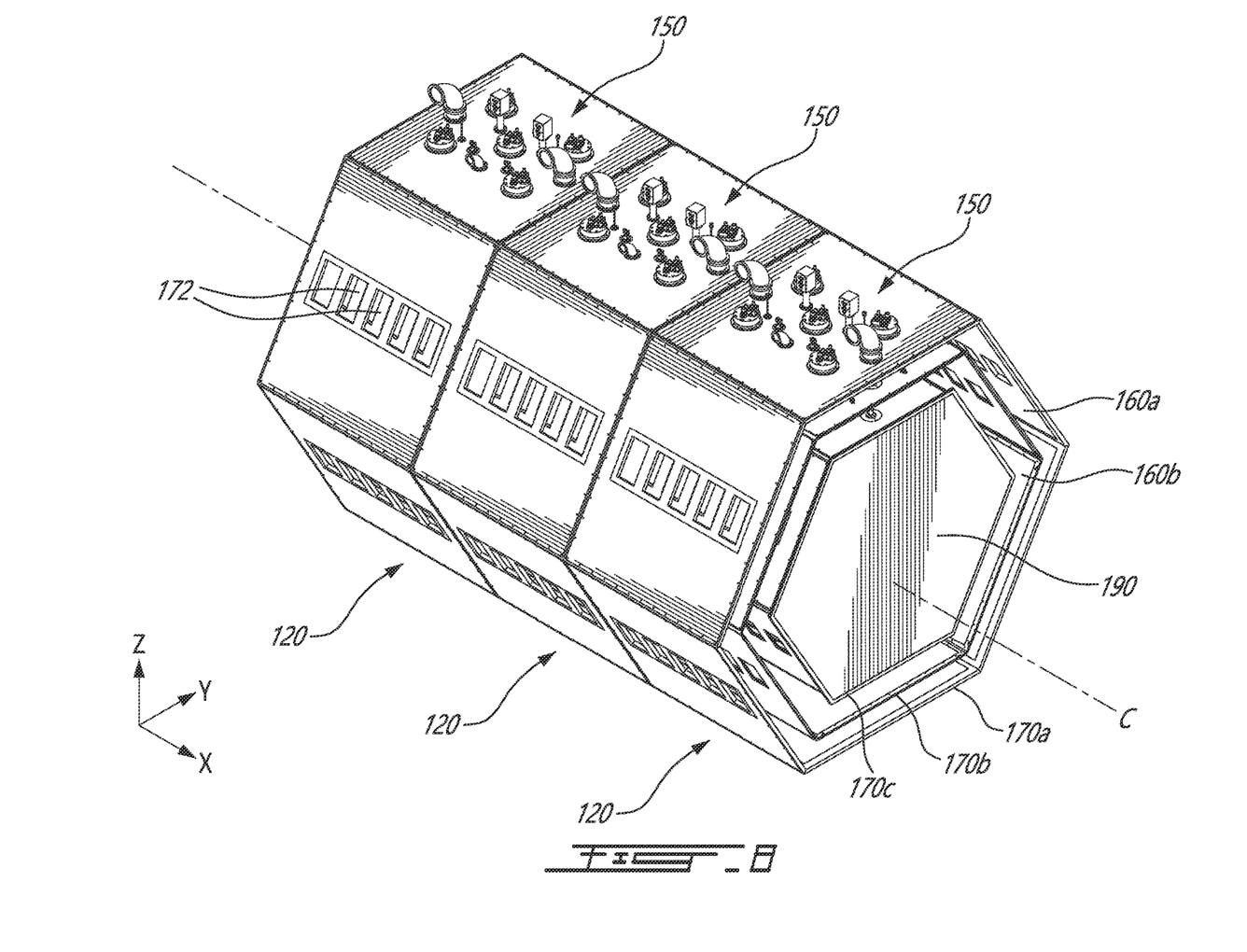
FIG. 8 is perspective view of the modular cryostat assembly of FIG. 7, shown partially closed.

Referring additionally to FIGS. 7 and 8, in some embodiments, the dilution refrigerator 140 may include two or more cryostats 120, i.e., a first cryostat 120 and a second cryostat 120, arranged together, adjacent one another in series, and combined such that they may function as a single cryostat 120. Illustratively, three such cryostats 120 are positioned in series along the central axis C with the various temperature stages T of each cryostat 120 open to each other. In other words, end plates 190 are not installed on the middle cryostat 120 or on the inner sides of the two outer cryostats 120 so that the various interconnected walls 170 of each cryostat 120 may be directly or indirectly coupled to each other along the central axis C, effectively enlarging the length of each temperature stage T along the central axis C (and thus the overall volume of each temperature stage T). In the depicted embodiment, each cryostat 120 abuts an adjacent cryostat 120 along the central axis C. In other embodiments, the cryostats 120 may be spaced apart and indirectly coupled via an additional interfacing component. The dilution refrigerator 140 composed of one or more of the present cryostats 120 may thus be considered modular, as a varying number of cryostats 120, each with their own associated quantum processor 110, may be combined to form a larger and thus more capable system (for instance, to increase the qubit capacity of the quantum computing system 100) that may occupy a smaller footprint than an equivalent number of individual systems. In addition, cooling requirements for the above-described lengthened temperature stages T may be less onerous in relation to individual comparable temperature stages, and the cooling efficiency and speed may increase as well. Thus, the design and configuration of the cryostat 120 permits it to be readily scaled, such as to create a much larger and thus more powerful (e.g. a greater number of qubits possible) quantum computing system 100. By permitting multiple cryostats 120 to be arranged in series, a resulting larger cryostat is formed that permits further expansion, as required, simply by adding additional cryostat units 120 in series.

Each of the embodiments and/or features described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments may also referred to herein as examples. Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

Following from the above description and invention summaries, it should be apparent to those of ordinary skill in the art that, while the methods and apparatuses herein described constitute exemplary embodiments of the present invention, it is to be understood that the inventions contained herein are not limited to the above precise embodiment and that changes may be made without departing from the scope of the invention as defined by the following proposed points of novelty. Likewise, it is to be understood that it is not necessary to meet any or all of the identified advantages or objects of the invention disclosed herein in order to fall within the scope of the invention, since inherent and/or unforeseen advantages of the present invention may exist even though they may not have been explicitly discussed herein.

The invention claimed is:

1. A cryostat, the cryostat comprising:
    temperature-controlled flanges operable to be cooled to respective cryogenic target temperatures, the temperature-controlled flanges being nested one inside another and concentrically arranged about a central axis, the temperature-controlled flanges being radially spaced apart and each defining a closed polygonal perimeter, the temperature-controlled flanges including an outermost flange defining a vacuum chamber, an innermost flange enclosing a central core of the cryostat, and intermediate flanges radially located between the innermost flange and the outermost flange, each of the intermediate flanges surrounding one or more of the temperature-controlled flanges; and
    wherein the outermost flange is maintained at a highest temperature, the innermost flange is maintained at a lowest temperature, and the intermediate flanges are maintained at respective intermediate temperatures less than the highest temperature and greater than the lowest temperature;
    wherein each of the temperature-controlled flanges includes a set of interconnected walls defining the closed polygonal perimeter about the central axis;
    wherein the set of interconnected walls of the innermost flange includes a greater number of interconnected walls than one or more of the sets of interconnected walls of the temperature-controlled flanges.

2. The cryostat as defined in claim 1, wherein each said set of interconnected walls including at least two non-parallel walls.

3. The cryostat as defined in claim 1, wherein the closed polygonal perimeter of the innermost flange defines a first polygonal shape in a plane normal to the central axis and the closed polygonal perimeter of at least one of the remaining temperature-controlled flanges defines a second polygonal shape in the plane.

4. The cryostat as defined in claim 3, wherein the second polygonal shape is different than the first polygonal shape.

5. The cryostat as defined in claim 1, wherein the closed polygonal perimeter of at least one of the temperature-controlled flanges defines a hexagonal shape in a plane normal to the central axis.

6. The cryostat as defined in claim 1, wherein at least one wall of the set of interconnected walls defining the innermost flange is parallel to at least one wall of said set of interconnected walls of the temperature-controlled flanges.

7. The cryostat as defined in claim 1, wherein the at least one wall of the set of interconnected walls defining the innermost flange and the at least one wall of said set of interconnected walls of the temperature-controlled flanges each include one or more aligned apertures defined therethrough to provide line of sight access extending through the aligned apertures from an exterior of the cryostat to the central core enclosed within the innermost flange.

8. The cryostat as defined in claim 1, wherein the central axis extends in a non-vertical direction.

9. The cryostat as defined in claim 8, wherein the central axis extends horizontally.

10. A quantum computing system, comprising:
a quantum processor comprising at least one qubit;
quantum hardware connected to the quantum processor; and
a dilution refrigerator comprising:
a pumping system; and
a cryostat in communication with the pumping system for circulation of a cooling mixture therethrough, comprising temperature-controlled flanges nested one inside another and concentrically arranged about a central axis, the central axis extends horizontally, the temperature-controlled flanges being radially spaced apart and each defining a closed polygonal perimeter, the temperature-controlled flanges defining cooling stages between radially-adjacent ones of the temperature-controlled flanges, the temperature-controlled flanges including an outermost flange defining a vacuum chamber, an innermost flange enclosing a central core of the cryostat housing the quantum processor, and intermediate flanges radially located between the innermost flange and the outermost flange, each of the intermediate flanges surrounding one or more of the temperature-controlled flanges;
wherein the pumping system is operable to cool at least the intermediate flanges and the innermost flange to respective cryogenic target temperatures, with the outermost flange at a highest temperature, the innermost flange maintained at a lowest temperature, and the intermediate flanges maintained at respective intermediate temperatures less than the highest temperature and greater than the lowest temperature;
wherein each of the temperature-controlled flanges includes a set of interconnected walls defining the closed polygonal perimeter about the central axis.

11. The quantum computing system as defined in claim 10, further comprising one or more additional cryostats aligned with the cryostat along the central axis and engaged in series therewith to form a larger modular cryostat, wherein each of the cooling stages of the cryostat are open to corresponding cooling stages of the one or more additional cryostats.

12. The quantum computing system as defined in claim 10, wherein each said set of interconnected walls including at least two non-parallel walls.

13. The quantum computing system as defined in claim 10, wherein the closed polygonal perimeter of the innermost flange defines a first polygonal shape in a plane normal to the central axis and the closed polygonal perimeter of at least one of the remaining temperature-controlled flanges defines a second polygonal shape in the plane different than the first polygonal shape.

14. The quantum computing system as defined in claim 10, wherein the closed polygonal perimeter of at least one of the temperature-controlled flanges defines a hexagonal shape in a plane normal to the central axis.

15. The quantum computing system as defined in claim 10, wherein at least one wall of the set of interconnected walls defining the innermost flange is parallel to at least one wall of each set of interconnected walls of the temperature-controlled flanges.

16. The quantum computing system as defined in claim 15, wherein the at least one wall of the set of interconnected walls defining the innermost flange and the at least one wall of each set of interconnected walls of the temperature-controlled flanges each include one or more aligned apertures defined therethrough to provide line of sight access extending through the aligned apertures from an exterior of the cryostat to the central core enclosed within the innermost flange.

17. The quantum computing system as defined in claim 12, wherein the set of interconnected walls of the innermost flange includes a greater number of interconnected walls than one or more of the sets of interconnected walls of the remaining of the temperature-controlled flanges.

18. A modular cryostat assembly comprising two or more cryostats, each cryostat of the two or more cryostats comprising:
temperature-controlled flanges operable to be cooled to respective target temperatures, the temperature-controlled flanges being nested one inside another and concentrically arranged about a central axis, the central axis extends horizontally, the temperature-controlled flanges defining cooling stages between radially-adjacent ones of the temperature-controlled flanges, the temperature-controlled flanges including an outermost flange defining a vacuum chamber, an innermost flange enclosing a central core of the cryostat, and intermediate flanges radially located between the innermost flange and the outermost flange, each of the intermediate flanges surrounding one or more of the temperature-controlled flanges, the outermost flange operating at a highest temperature, the innermost flange operating at a lowest temperature, and the intermediate flanges operating at respective intermediate temperatures less than the highest temperature and greater than the lowest temperature; and
wherein each of the temperature-controlled flanges of the two or more cryostats includes a set of interconnected walls defining closed polygonal perimeters about the central axis;
wherein the two or more cryostats include a first cryostat and a second cryostat arranged adjacent one another in series, the first cryostat and the second cryostat being concentric with the central axis, axial ends of the temperature-controlled flanges of the first cryostat being connected with axial ends of corresponding ones of the temperature-controlled flanges of the second cryostat, and the cooling stages of the first cryostat being open to corresponding ones of the cooling stages of the second cryostat.

19. The modular cryostat assembly as defined in claim 18, wherein each said set of interconnected walls including at least two non-parallel walls.

20. The modular cryostat assembly as defined in claim 18, wherein the set of interconnected walls of the innermost flange includes a greater number of interconnected walls than at least one of the sets of interconnected walls of the temperature-controlled flanges.

21. The modular cryostat assembly as defined in claim 18, wherein at least one wall of the set of interconnected walls defining the innermost flange is parallel to at least one wall of said set of interconnected walls of the temperature-controlled flanges.

\* \* \* \* \*